(12) United States Patent
Ledbetter et al.

(10) Patent No.: US 7,994,783 B2
(45) Date of Patent: Aug. 9, 2011

(54) INTEGRATED MICROCHIP INCORPORATING ATOMIC MAGNETOMETER AND MICROFLUIDIC CHANNEL FOR NMR AND MRI

(75) Inventors: Micah P. Ledbetter, Oakland, CA (US); Igor M. Savukov, Los Alamos, NM (US); Dmitry Budker, El Cerrito, CA (US); Vishal K. Shah, Plainsboro, NJ (US); Svenja Knappe, Boulder, CO (US); John Kitching, Boulder, CO (US); David J. Michalak, Berkeley, CA (US); Shoujun Xu, Houston, TX (US); Alexander Pines, Berkeley, CA (US)

(73) Assignee: The Regents of the Univerisity of California, Oakland, CA (US)

( * ) Notice: Subject to any disclaimer, the term of this patent is extended or adjusted under 35 U.S.C. 154(b) by 184 days.

(21) Appl. No.: 12/367,292

(22) Filed: Feb. 6, 2009

(65) Prior Publication Data
US 2009/0256561 A1 Oct. 15, 2009

Related U.S. Application Data

(60) Provisional application No. 61/027,311, filed on Feb. 8, 2008, provisional application No. 61/027,703, filed on Feb. 11, 2008.

(51) Int. Cl.
*G01V 3/00* (2006.01)
(52) U.S. Cl. ......... 324/306; 324/303; 324/322; 324/318
(58) Field of Classification Search .......... 324/300–322; 385/129, 131; 382/128–131; 600/407–435
See application file for complete search history.

(56) References Cited

U.S. PATENT DOCUMENTS

| | | | | |
|---|---|---|---|---|
| 6,194,900 | B1 * | 2/2001 | Freeman et al. | 324/321 |
| 6,310,480 | B1 * | 10/2001 | Cohen et al. | 324/321 |
| 6,822,454 | B2 * | 11/2004 | Peck et al. | 324/321 |
| 7,127,146 | B2 * | 10/2006 | Schmidt et al. | 385/129 |
| 7,141,978 | B2 * | 11/2006 | Peck et al. | 324/321 |
| 7,149,396 | B2 * | 12/2006 | Schmidt et al. | 385/131 |
| 7,248,771 | B2 * | 7/2007 | Schmidt et al. | 385/129 |
| 7,444,053 | B2 * | 10/2008 | Schmidt et al. | 385/129 |
| 7,573,264 | B2 * | 8/2009 | Xu et al. | 324/304 |
| 7,652,473 | B2 * | 1/2010 | Kawabata | 324/304 |
| 2002/0149369 | A1 * | 10/2002 | Peck et al. | 324/321 |
| 2004/0252957 | A1 * | 12/2004 | Schmidt et al. | 385/131 |

(Continued)

OTHER PUBLICATIONS

Xu et al., "Magnetic resonance imaging with an optical atomic magnetometer," Proceedings of the National Academy of Sciences, vol. 103, No. 34, pp. 12668-12671, (Aug. 22, 2006).

(Continued)

*Primary Examiner* — Melissa Koval
*Assistant Examiner* — Tiffany Fetzner
(74) *Attorney, Agent, or Firm* — Leonard T. Guzman; Ernest Orlando Lawerence Berkeley

(57) ABSTRACT

An integral microfluidic device includes an alkali vapor cell and microfluidic channel, which can be used to detect magnetism for nuclear magnetic resonance (NMR) and magnetic resonance imaging (MRI). Small magnetic fields in the vicinity of the vapor cell can be measured by optically polarizing and probing the spin precession in the small magnetic field. This can then be used to detect the magnetic field of in encoded analyte in the adjacent microfluidic channel. The magnetism in the microfluidic channel can be modulated by applying an appropriate series of radio or audio frequency pulses upstream from the microfluidic chip (the remote detection modality) to yield a sensitive means of detecting NMR and MRI.

6 Claims, 3 Drawing Sheets

U.S. PATENT DOCUMENTS

| | | | | |
|---|---|---|---|---|
| 2005/0253587 | A1* | 11/2005 | Peck et al. | 324/321 |
| 2006/0008227 | A1* | 1/2006 | Schmidt et al. | 385/129 |
| 2006/0098927 | A1* | 5/2006 | Schmidt et al. | 385/129 |
| 2006/0251371 | A1* | 11/2006 | Schmidt et al. | 385/129 |
| 2007/0205767 | A1 | 9/2007 | Xu et al. | |
| 2009/0001979 | A1* | 1/2009 | Kawabata | 324/244.1 |
| 2009/0256561 | A1* | 10/2009 | Ledbetter et al. | 324/305 |

OTHER PUBLICATIONS

Granwehr et al., "Dispersion measurements using time-of-flight remote detection MRI," Magnetic Resonance Imaging, vol. 25, No. 4, pp. 449-452, (2007).

Harel et al., "Time-of-Flight Flow Imaging of Two-Component Flow inside a Microfluidic Chip," Physical Review Letters, vol. 98, pp. 017601-1-017601-4, (2007).

Anwar et al., "Spin Coherence Transfer in Chemical Transformations Monitored by Remote Detection NMR," Analytical Chemistry, vol. 79, No. 7, pp. 2806-2811, (Apr. 1, 2007).

Schwindt et al., "Chip-scale atomic magnetometer," Applied Physics Letters, vol. 85, No. 26, pp. 6409-6411, (Dec. 27, 2004).

Kominis et al., "A subfemtotesla multichannel atomic magnetometer," Nature, vol. 422, pp. 596-599 (Apr. 10, 2003).

Shah et al., "Subpicotesla atomic magnetometry with a microfabricated vapour cell," Nature Photonics, vol. 1, pp. 649-652, (Nov. 2007).

Ledbetter et al., "Zero-field remote detection of NMR with a microfabricated atomic magnetometer," Proceedings of the National Academy of Sciences, vol. 105, No. 7, pp. 2286-2290, (online Feb. 6, 2008).

Moule et al., "Amplification of xenon NMR and MRI by remote detection," Proceedings of the National Academy of Sciences, vol. 100, No. 16, pp. 9122-9127, (Aug. 5, 2003).

* cited by examiner

INTEGRATED MICROCHIP INCORPORATING ATOMIC MAGNETOMETER AND MICROFLUIDIC CHANNEL FOR NMR AND MRI

RELATED APPLICATIONS

This application claims the benefit of U.S. Provisional Patent Application No. 61/027,311, filed on Feb. 8, 2008, and U.S. Provisional Patent Application No. 61/027,703, filed on Feb. 11, 2008, both of which are hereby incorporated by reference.

STATEMENT OF GOVERNMENTAL SUPPORT

This invention was made with government support under Contract No. DE-AC02-05CH11231 awarded by the US Department of Energy, under ONR MURI grant No. FD-N090014-05-1-0406, and with funds supplied by the National Institute of Standards and Technology, a non-regulatory federal agency within the US Department of Commerce. The government has certain rights in this invention.

BACKGROUND OF THE INVENTION

This invention relates to the field of NMR and MRI and, more particularly, to the field of NMR and MRI where an optical magnetometer is used to detect magnetization.

Nuclear magnetic resonance (NMR) and magnetic resonance imaging (MRI) are widely used in healthcare, chemical analysis and geology. In many cases, MRI instruments are large (room-sized), expensive (several million dollars) and cumbersome to operate. The reason MRI instruments are large is that most are based on very high magnetic fields produced by superconducting electromagnets, which require liquid helium cryostats. The high magnetic field is needed for two reasons: 1) to produce a large nuclear polarization within the sample and 2) to generate a large nuclear precession frequency that can then be measured via inductive detection with a coil. Since inductive detection is sensitive to the time derivative of the magnetic flux through the coil, high sensitivity is achieved only at high frequencies (high magnetic field).

Low-field MRI is a growing area within the large MRI field. Remote detection is an important emerging modality for MRI in low magnetic fields. In this technique, the polarization, encoding and detection of nuclei are spatially separated. Polarization is typically accomplished by thermalization in a large magnetic field or using optical pumping techniques. After polarization, the nuclei then flow into the sample to be tested (a human lung, a porous rock, etc.) and DC and RF fields and gradients are applied to "encode" information about the sample onto the nuclear spins. The encoded fluid is then brought into a highly shielded enclosure and the magnetization is recorded as a function of time. By changing the encoding parameters over time, a spatial image of the sample can be created from the time-varying magnetization in the measurement region. Because no especially high magnetic fields are required, the system does not need to be cryogenically cooled, which significantly reduces the complexity and cost.

Low-field MRI places specific requirements on the magnetometers. Perhaps the most important requirement is that the magnetometers operate with high sensitivity at the very low frequencies associated with the low magnetic fields. The most sensitive DC magnetometers have traditionally been superconducting quantum interference devices (SQUIDs) based on Josephson junctions. These have very high sensitivity (approaching 1 $fT/Hz^{1/2}$) but are again large and cumbersome to operate because of the cryogenic cooling required to reach the superconducting state. Existing compact sensors (magneto-resistive sensors, for example) are typically not sensitive enough to enable low-noise recording of the very weak nuclear polarization.

More generally, remote detection of NMR, in which polarization, encoding or evolution, and detection are spatially separated, has recently attracted considerable attention in the context of MRI (see Xu, S., et al., *Magnetic resonance imaging with an optical atomic magnetometer*, Proc. Nat. Acad. Sci., 103 129668-129671), microfluidic flow profiling (see Granwehr, J., et al., *Dispersion measurements using time-of-flight remote detection MRI*, Magn. Res. Imaging, 25, 449-452, and Harel, E., et al., *Time of flight flow imaging of two-component flow inside a microfluidic chip*, Phys. Rev. Lett. 98, 017601), and spin-labeling (see Anwar, M. S., et al., *Spin coherence transfer in chemical transformations monitored by remote NMR*, Anal. Chem., 79, 2806-2811). Detection can be performed with SQUIDs inductively at high fields as taught by Granwehr et al., Harel et al., and Anwar et al., or with atomic magnetometer as taught by Xu et al. In order to efficiently detect the flux from the nuclear sample, it is typically necessary to match the physical dimensions of the sensor and the sample. Thus, small, sensitive detectors of magnetic flux reduce the detection volume, thereby reducing the quantity of analyte. Microfabricated atomic magnetometers (see Schwindt, P. D. D., et al., *Chip scale atomic magnetometer*, App. Phys. Lett., 85, 6409-6411) with sensor dimensions on the order of 1 mm operating in the spin-exchange relaxation free (SERF) regime (see Kominis, I. K., et al., *A subfemtotesla multichannel atomic magnetometer*, Nature 422, 596-599) have recently demonstrated sensitivities of ~70 $fT/Hz^{1/2}$ (see Shah, V., et al., *Subpicotesla atomic magnetometery with a microfabricated vapour cell*, Nat. Photonics 1, 649-652).

SUMMARY OF THE INVENTION

The present invention improves on existing remote detection of low-field NMR and its application in MRI in two important ways. First, the invention uses a very small alkali vapor cell with dimensions on the order of 1 mm and sensitivity in the range of 100 $fT/Hz^{1/2}$ in the frequency band of 1 Hz to 100 Hz. This sensitivity is sufficient for detecting the very small DC magnetic field produced by a small sample of a fluid such as water prepolarized in a 1 T (or less) magnetic field. Second, the fabrication process allows for integration of the alkali vapor cell adjacent to a micro-fluidic channel within an integral microfluidic device. This allows very small fluidic samples to be brought very close to the magnetometer. Because the fabrication process is based on lithographically-defined patterning, it is highly scalable and could be miniaturized far beyond the current device. Further miniaturization implies not only reduced cost, but also improved sensitivity to very small samples, since the fluid can be brought even closer to the magnetometer. The device could easily incorporate multiple alkali vapor cells and interconnecting microfluidic channels to study fluid mixing and reactions directly on the integral microfluidic device.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION

The design and use of laser based atomic magnetometers in the context of NMR and MRI is disclosed in US published patent application US 2007/0205767, the contents of which is hereby incorporated by reference in its entirety. In that application, a laser based atomic magnetometer apparatus is described for the measurement of magnetic fields, the apparatus including a plurality of alkali vapor cells to detect magnetic fields, a laser source optically coupled to the alkali vapor cells, and a signal detector that measures the laser source after being coupled to the alkali vapor cells. There too, it was disclosed that a single alkali vapor cell may be used for nuclear magnetic resonance detection by pre-polarizing the nuclear spins of an analyte, encoding spectroscopic and/or spatial information, and detecting the flux in NMR signals from the analyte using a laser based atomic magnetometer apparatus.

Figure 1:
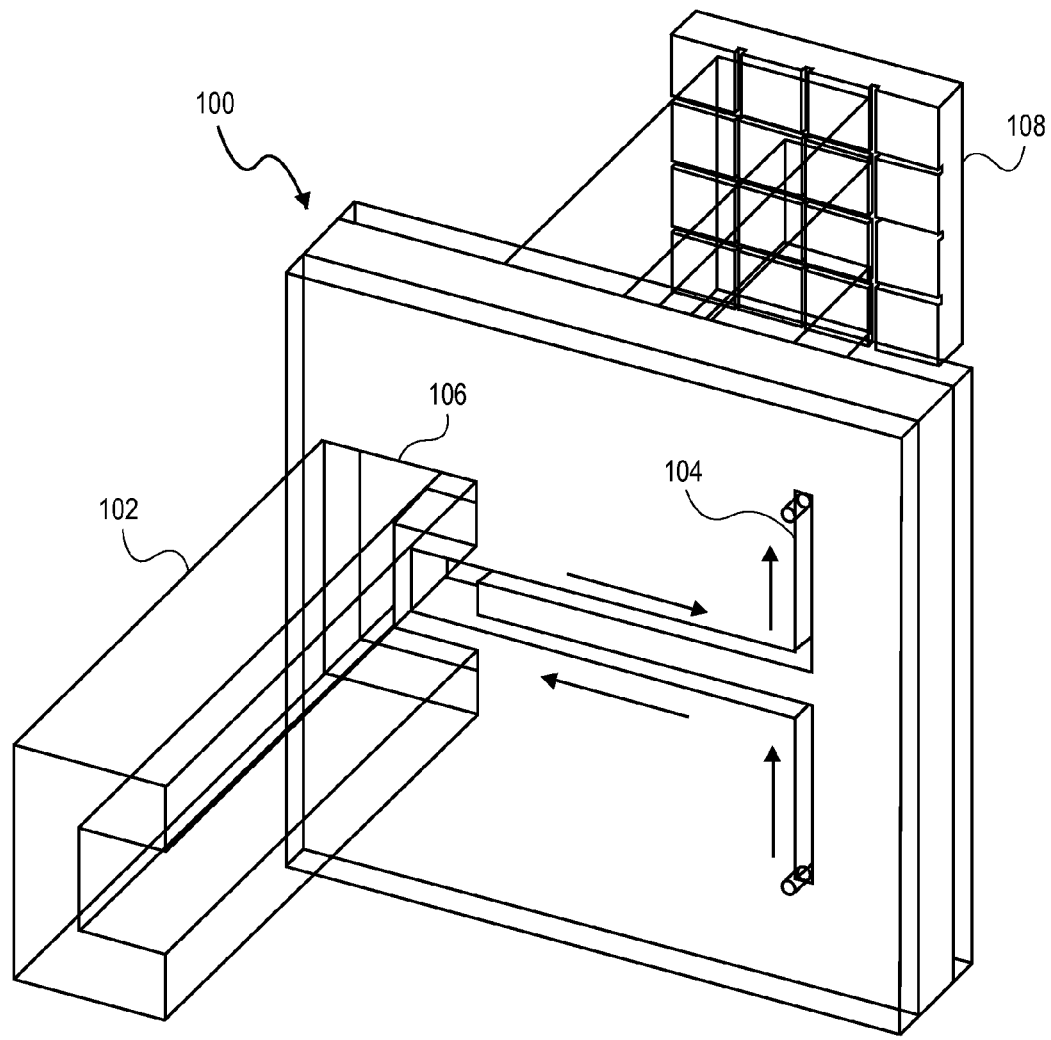
FIG. 1 illustrates a microfluidic device including an alkali vapor cell and a microfluidic channel where the alkali vapor cell is illuminated by a laser beam and a segmented photodiode detects the laser beam after its transmission through the alkali vapor cell according to an embodiment of the present invention.

By way of this invention, the system has been miniaturized further by incorporation of the vapor cell into the microfluidic chip itself. Here, a microfluidic channel is first formed by etching the desired channel or channels onto a silicon substrate, as well as etching a void volume to provide for the alkali vapor cell. After etching, glass may be anodically bonded to the silicon substrate to form the chip "sandwich" as shown in FIG. 1. In one embodiment the vapor cell is positioned as close as possible to the fluidic channel to be interrogated. In another embodiment, more than one vapor cell can be incorporated into the microfluidic chip at different locations in order to obtain readings at various points along the fluid flow path. Such multiple readings may be useful for example in tracking chemical changes in the course of fluid mixing or the progress of chemical reactions. The vapor cell(s) may contain for example cesium, rubidium, or potassium as described in the referenced application and below referenced paper. For small vapor cells it also typically desirable to include a buffer gas such as helium or nitrogen to reduce the rate of diffusion to the walls and thereby reduce the relaxation rate of the alkali vapor.

For detection, a near resonant laser beam is directed to the alkali vapor cell as illustrated in the figures. In FIG. 1, a laser beam 102 is used both for optical pumping and probing of the alkali spin precession. The laser beam 102 may be partially shielded such that the beam does not fall onto the fluid within the fluidic channel 104, but instead is directed solely to the vapor cell 106. The microfluidic chip 100 with its on-board alkali vapor cell 106 is housed inside a multi-layer magnetic shield (not shown). A segmented photodiode 108 is positioned behind the vapor cell 106, to monitor the intensity (or polarization) of the transmitted probe beam. Changes in intensity of the transmitted light as a result of changes induced in the vapor cell by the passing of the encoded fluid are detectable at the photo diode.

In the disclosed configuration of the magnetometer of FIG. 1, a single, circularly polarized laser beam optically polarizes orientation in the ground state of the alkali atoms. A fully polarized vapor is transparent to the circularly polarized light. A small magnetic field applied to the alkali vapor induces precession of the oriented alkali vapor about the magnetic field, reducing the intensity of the transmitted light which is monitored by the photodiode, thereby producing a measure of the magnetic field.

In FIG. 1, a segmented photodiode 108 is shown, which enables the realization of spatial resolution of the detected volume. However if spatial resolution is not necessary, a single photodiode is sufficient. The single beam scheme discussed here and shown in FIG. 1 is only one possibility. Other configurations using two beams to pump End probe either orientation or alignment of the alkali vapor, each with various advantages are possible. Furthermore, the use of light pipes or fiber optics to bring one or more laser beams to one or more vapor cells can allow for a more compact system.

Polarization of the nuclei can be accomplished in a variety of ways: by thermalization in a large magnetic field in a remote location, by spin-exchange optical pumping, or via para-hydrogen induced polarization. Since the magnetic field due to the polarized nuclei drops off roughly as the cube of the distance from the sensor to the sample, in order to maximize the sensitivity to a small number of nuclei, it is of great importance to minimize the distance from the sample to the cell.

Figure 2:
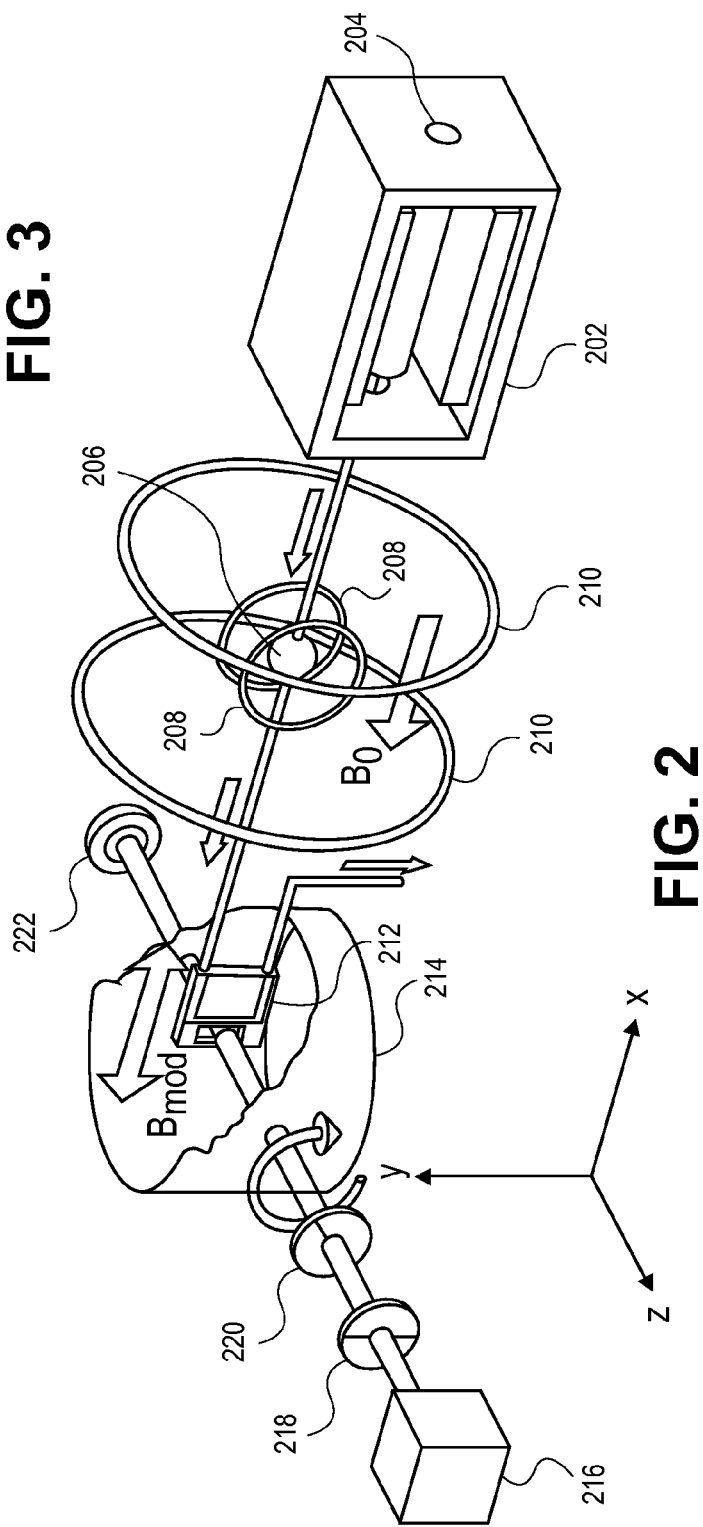
FIG. 2 illustrates an optical magnetometer system for NMR and MRI according to an embodiment of the present invention.

As shown in FIG. 2, the analyte (e.g., water) enters the magnet assembly 202 through an entry port 204, where it is prepolarized by passing it through the magnetic field of a permanent magnet. From there, the prepolarized fluid enters an encoding bulb 206 that is surrounded by a Hemholtz coil 208, used to apply audio frequency (AF) pulses to the analyte in the encoding bulb 206, and an anti-Hemholtz coil 210, that may be used to shim longitudinal gradients of an ambient field that may be present. Other arrangements of coils may be used in the encoding region. From the encoding bulb, the analyte flows to an embodiment of a microfluidic chip 212 of the present invention. The microfluidic chip 212 is surrounded by a magnetic shield 214, which may be a four-layer magnetic shield. An external cavity diode laser 216 generates a laser beam, which is polarized by linear polarizer 218 and circularly polarized by quarter wave plate 220. The circularly polarized laser beam passes through the alkali vapor cell of the microfluidic chip 212 and is detected by photodiode 222.

Figure 3:
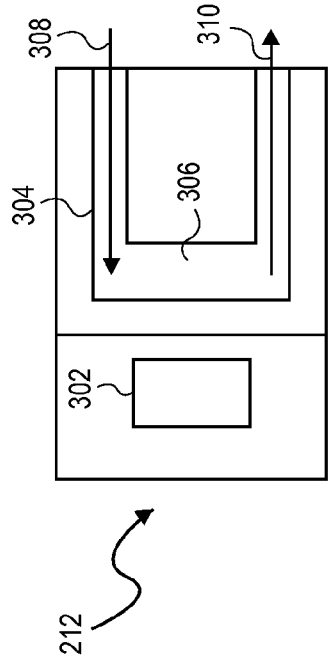
FIG. 3 illustrates an embodiment of a microfluidic device of the present invention.
Figure 4:
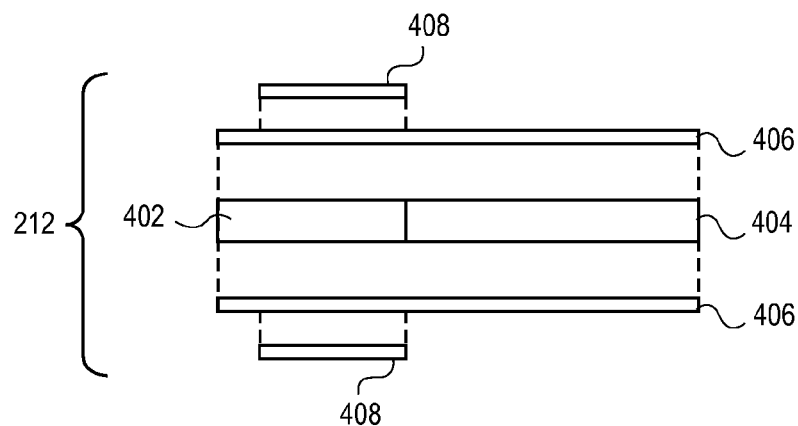
FIG. 4 illustrates an exploded side view of an embodiment of a microfluidic device of the present invention.
Figure 5:
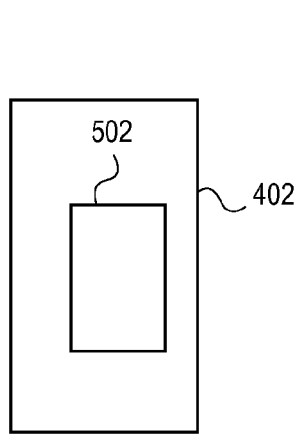
FIG. 5 illustrates a portion of a vapor cell that in combination with a pair of transparent plates forms an alkali vapor cell in accordance with an embodiment of the present invention.
Figure 6:
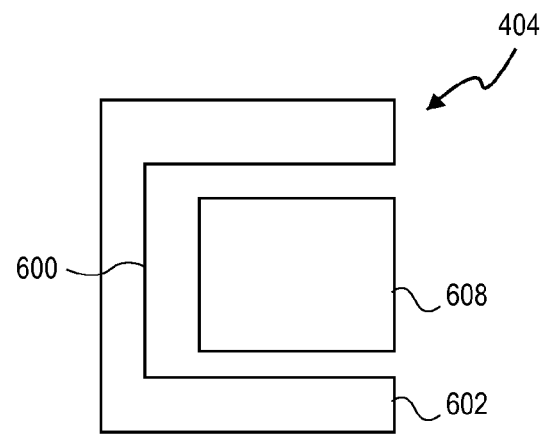
FIG. 6 illustrates a portion of a microfluidic channel that in combination with a pair of transparent plates forms the microfluidic channel in accordance with an embodiment of the present invention.

An embodiment of the microfluidic chip 212 is further illustrated in FIG. 3. The microfluidic chip 212 includes the alkali vapor cell 302 and the microfluidic channel 304, which includes a detection region 306. An analyte niters the microfluidic chip 211 as shown by arrow 308 and exits the chip 211 as shown by arrow 310. The embodiment of the microfluidic chip 212 is further illustrated in FIG. 4, which is an exploded side view of the microfluidic chip 212. The microfluidic chip is manufactured by sandwiching a vapor cell portion 402 and a microfluidic channel portion 404 between transparent plates 406. In an embodiment, the vapor cell portion 402 and the microfluidic channel portion 404 are made of silicon and the transparent plates 406 are made of glass. The vapor cell portion 402 and the microfluidic channel portion 404 may be formed by photolithography and etching of silicon. The transparent plates 406 may be anodically bonded to the vapor cell portion 402 and the microfluidic channel portion 404. The vapor cell portion 402 and the transparent plates 406 adjacent to it are sandwiched between transparent ITO (indium tin oxide) resistive heaters 408. The vapor cell portion 402 is further illustrated in FIG. 5, which shows a cut-out 502 which forms a boundary for the vapor of the alkali vapor cell. The microfluidic channel portion 404 is further illustrated in FIG. 6, which shows the microfluidic channel 600 formed by an outer channel piece 602 and an inner channel piece 608.

Measuring nuclear magnetic resonance with the device of FIG. 1 and the system of FIG. 2 via a remote modality in which encoding or manipulation of nuclear spins (accomplished by applying pulses of AF or RF fields) occurs in a remote location, is described in more detail in, M. P. Ledbetter, et. al., *Zero-field Remote Detection of NMR with a Microfabricated Atomic Magnetometer*, Proceedings of the National Academy of Sciences (published on-line, Feb. 6, 2008), a pre-publication copy of which forms a portion of each of the U.S. Provisional Patent Applications identified in the related applications section above.

One may also measure NMR directly. This could be accomplished by incorporating a solenoid into the device shown in FIG. 1 in such a way that a magnetic field can be applied to the nuclear sample without generating a substantial field in the volume occupied by the magnetometer. NMR may also be directly detected by appropriate application of two oscillating or rotating fields in the presence of a finite magnetic field common to both vapor cell and microfluidic channel, similar to the well known Hartmann-Hahn frequency matching technique.

The optimal shape and size of the fluid channels and vapor cell is dependent on the desired application. The configuration of the fluid channel in FIG. 1 was chosen because the resulting field from the polarized nuclei in the detection volume is simple, roughly that of a dipole. The shape of the alkali vapor cell is somewhat arbitrary and can be tailored to the desired application. Here it was chosen to maximize the volume of alkali vapor and minimize the average distance from the vapor cell to the sample. More complicated arrangements can easily be conceived with interconnecting microfluidic channels and multiple atomic vapor cells.

The device described here presents a means of detection of NMR in magnetic fields near zero. The advantages of working at small magnetic fields are numerous: no cryogenics are required, noise associated with currents used to null the field are minimized, thermal polarization of nuclei can occur in relatively inhomogeneous magnetic fields produced by small permanent magnets, magnetic field homogeneity is not affected by the diamagnetic susceptibility of local materials, to name a few.

This invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

We claim:

1. An integral microfluidic device configured for NMR and MRI comprising:
    a microfluidic channel etched onto a silicon substrate; and
    an alkali vapor cell positioned adjacent to a section of the microfluidic channel, wherein the alkali vapor cell is within a void volume etched onto the silicon substrate,
    wherein the microfluidic channel is configured to bring fluidic samples close to a magnetometer and
    wherein the microfluidic channel and the alkali vapor cell are configured to be used for NMR detection system and for MRI.

2. The integral microfluidic device of claim 1 further comprising additional microfluidic channels
    wherein the additional microfluidic channels are configured to bring the fluidic samples close to the magnetometer and
    wherein the additional microfluidic channels are configured to be used for NMR detection and for MRI.

3. The integral microfluidic device of claim 1 further comprising an additional alkali vapor cell wherein the additional alkali vapor cell is configured to be used for NMR detection and for MRI.

4. The integral microfluidic device of claim 3 wherein the additional alkali vapor cell is positioned adjacent to a different section of the microfluidic channel.

5. The integral microfluidic device of claim 1 wherein the alkali vapor cell is selected from the group consisting of cesium, rubidium, and potassium vapor cells.

6. The integral microfluidic device of claim 1 wherein the alkali vapor cell is a rubidium vapor cell.

* * * * *